(12) United States Patent
Tiwari

(10) Patent No.: US 8,004,310 B1
(45) Date of Patent: Aug. 23, 2011

(54) POWER SUPPLY REGULATION

(75) Inventor: Vipin Kumar Tiwari, Dublin, CA (US)

(73) Assignee: Synopsys, Inc., Mountain View, CA (US)

( * ) Notice: Subject to any disclaimer, the term of this patent is extended or adjusted under 35 U.S.C. 154(b) by 3 days.

(21) Appl. No.: 12/125,063

(22) Filed: May 22, 2008

(51) Int. Cl.
*H03B 1/00* (2006.01)
(52) U.S. Cl. .......................................... 326/81; 327/108
(58) Field of Classification Search .................. 327/108; 326/81; 323/283
See application file for complete search history.

(56) References Cited

U.S. PATENT DOCUMENTS

| | | | |
|---|---|---|---|
| 5,543,733 A * | 8/1996 | Mattos et al. | 326/81 |
| 5,808,500 A * | 9/1998 | Kalpakjian | 327/321 |
| 6,150,843 A * | 11/2000 | Shiffer et al. | 326/80 |
| 6,577,163 B1 * | 6/2003 | Waldrip et al. | 326/81 |
| 6,762,622 B2 * | 7/2004 | Lin et al. | 326/81 |
| 6,861,874 B1 * | 3/2005 | Chen et al. | 326/81 |
| 7,239,176 B2 * | 7/2007 | Gupta | 326/68 |
| 7,394,291 B2 * | 7/2008 | Narwal et al. | 326/81 |

* cited by examiner

*Primary Examiner* — Shawn Riley
(74) *Attorney, Agent, or Firm* — Kanika Radhakrishnan; Evergreen Valley Law Group, P.C.

(57) ABSTRACT

Power supply regulation. A power supply regulation system includes a transistor through which power is carried. The system also includes a switch connected to a gate of the transistor. Further, the system includes a transmission gate responsive to an input signal to apply a first signal level causing the transistor to enter an ON state in which the transistor carries full power, to apply a second signal level causing the transistor to enter an OFF state in which the transistor carries no power and to apply a third signal level causing the transistor to enter an INTERMEDIATE state in which the amount of power the transistor carries is controlled by the switch.

4 Claims, 6 Drawing Sheets

POWER SUPPLY REGULATION

BACKGROUND

Integrated circuits, for example, memories have different power requirements in different states. Examples of different states include but are not limited to a full power supply state and reduced power supply state. Examples of reduced power supply state include stand by mode or active mode at reduced power supply, and light sleep mode. FIG. 1a and FIG. 1b illustrate a traditional implementation of reduced power supply state. FIG. 1a includes a Positive-channel metal oxide semiconductor (PMOS) diode 102 and a PMOS transistor 104. When DS signal is LOW (0), a load 110 is in reduced power supply state. When DS signal is HIGH (1), load 110 is in shut down state. FIG. 1b includes a Negative-channel metal oxide semiconductor (NMOS) diode 106 and a NMOS transistor 108. When DS signal is LOW (0), load 110 is in reduced power supply state. When DS signal is HIGH (1), load 110 is in shut down state.

A traditional implementation of full power supply is also known as power gating implementation. FIG. 1c and FIG. 1d illustrate a traditional implementation of the power gating. FIG. 1c includes a PMOS transistor 112. When DS signal is LOW (0), load 110 is in full power supply state. When DS signal is HIGH (1), load 110 is in shut down state. FIG. 1d includes a NMOS transistor 114. When DS signal is LOW (0), load 110 is in full power supply state. When DS signal is HIGH (1), load 110 is in shut down state.

Over a period of time, a need has arose for implementing a single circuit for both full power supply state and reduced power supply state. FIG. 2a and FIG. 2b illustrate a combined circuit 200a and a combined circuit 200b for both full power supply state and reduced power supply state in accordance with a prior art. Combined circuit 200a includes PMOS diode 102, PMOS transistor 104 and PMOS transistor 112. Combined circuit 200b includes NMOS diode 106, NMOS transistor 108 and NMOS transistor 114. A table below illustrates the working of combined circuit 200a and combined circuit 200b.

TABLE 1

| DS | LS | Function |
|----|----|----|
| 0 | 0 | Full Power Supply |
| 0 | 1 | Reduced Power Supply |
| 1 | 0 | Shut Down State |
| 1 | 1 | Reduced Power Supply |

However, circuit 200a and circuit 200b leads to area inefficiency. PMOS diode 102, PMOS transistor 104, NMOS diode 106 and NMOS transistor 108 used are of large size which consumes area of a chip. Further, gate leakage and junction leakage is also high due to large size of PMOS diode 102, PMOS transistor 104, NMOS diode 106 and NMOS transistor 108.

In light of the foregoing discussion, there is a need of an area efficient implementation for power supply regulation.

SUMMARY

Embodiments of the invention described herein provide a method and a system for power supply regulation.

An example power supply regulation system includes a transistor through which power is carried. The system also includes a switch connected to a gate of the transistor. Further, the system includes a transmission gate responsive to an input signal to apply a first signal level causing the transistor to enter an ON state in which the transistor carries full power, to apply a second signal level causing the transistor to enter an OFF state in which the transistor carries no power and to apply a third signal level causing the transistor to enter an INTERMEDIATE state in which the amount of power the transistor carries is controlled by the switch.

Another example power supply regulation system includes a transistor connected to a load. The power supply regulation system also includes a transmission gate with an output connected to a gate of the transistor. The transmission gate includes a Positive-channel metal oxide semiconductor (PMOS) and a Negative-channel metal oxide semiconductor (NMOS) with source of the PMOS connected to drain of the NMOS and drain of the PMOS connected to source of the NMOS. The power supply regulation system also includes a switch connected to the output of the transmission gate and the gate of the transistor.

Yet another example power supply regulation system for regulating flow of power to a load includes a transistor that supplies power to the load. The system also includes a switch connected to a gate of the transistor. Further, the system includes a transmission gate responsive to an input signal to apply a first signal level to the transistor to apply full power to the load, to apply a second signal level to the transistor to shut down all power to the load and to apply a third signal level to the transistor to make the flow of power to the load responsive to the switch.

DETAILED DESCRIPTION OF THE EMBODIMENTS

Embodiments of the invention provide a method and a system for power supply regulation.

Figure 1B:
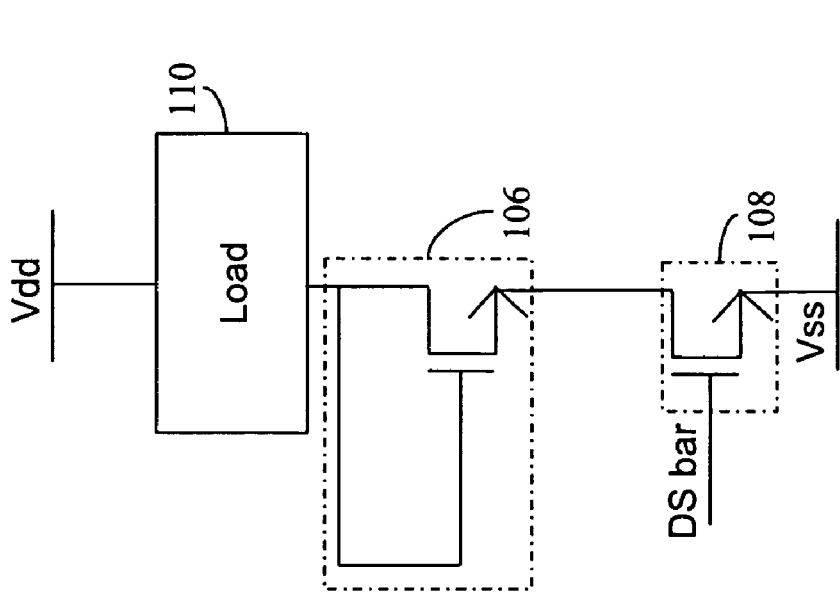
FIG. 1a, FIG. 1b, FIG. 1c and FIG. 1d illustrate implementations of different power requirement states of an integrated circuit in accordance with prior art.
Figure 1A:
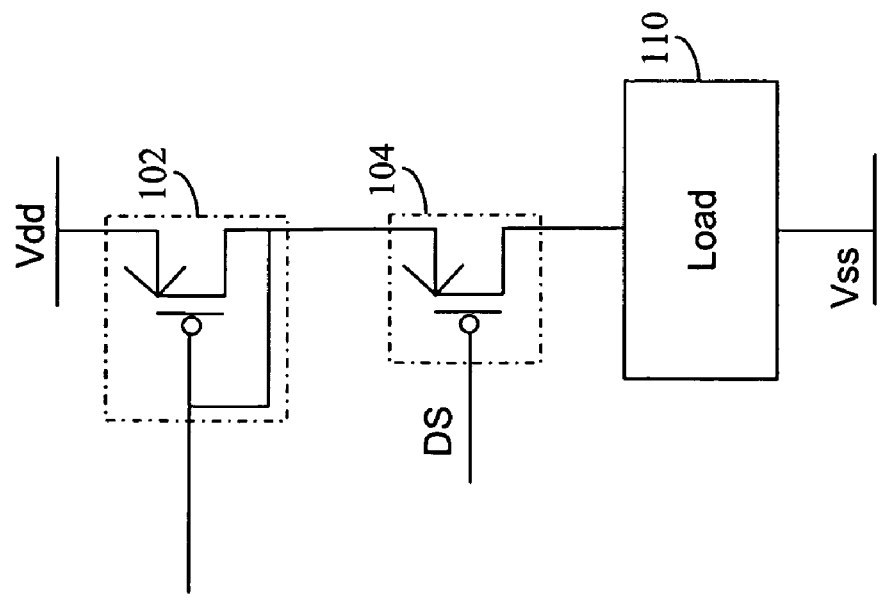
Figure 1D:
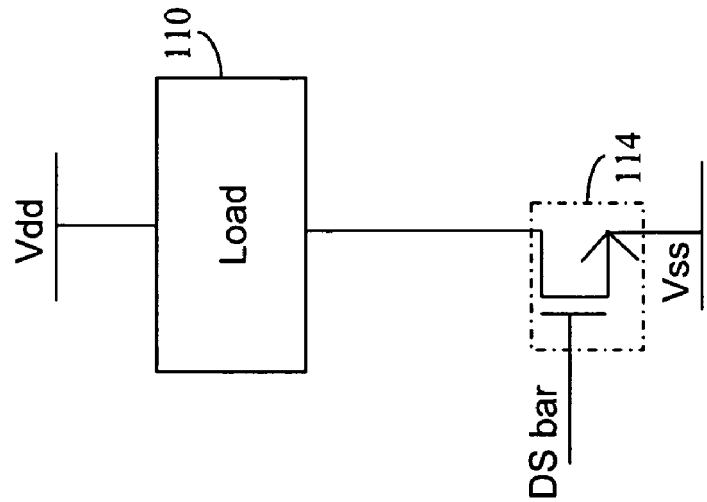
Figure 1C:
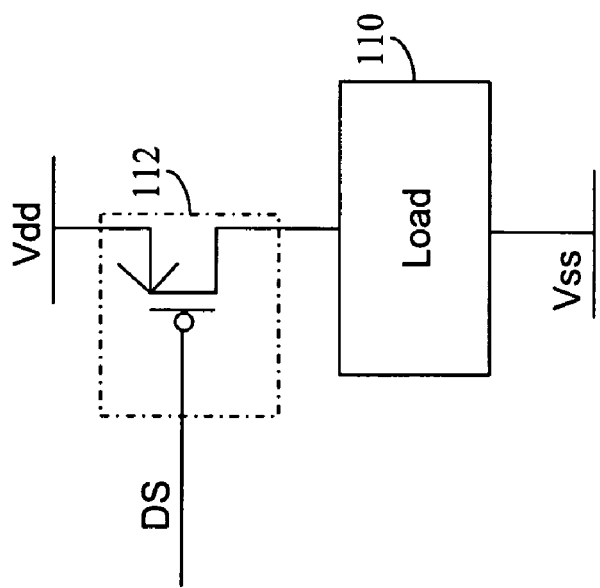
Figures 2A, 2B:
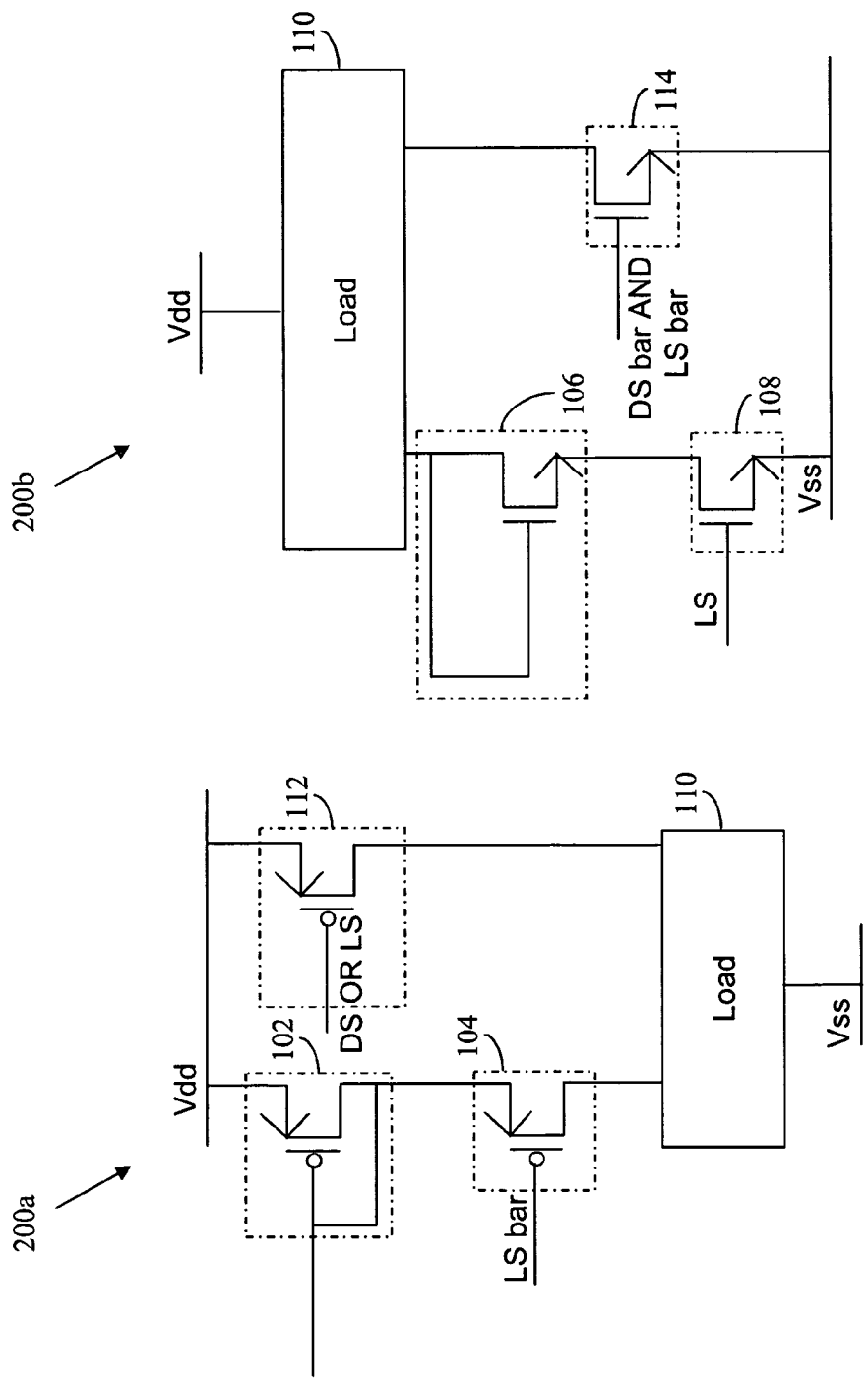
FIG. 2a and FIG. 2b illustrate a combined circuit for full power supply state and reduced power supply state in accordance with prior art.
Figure 3:
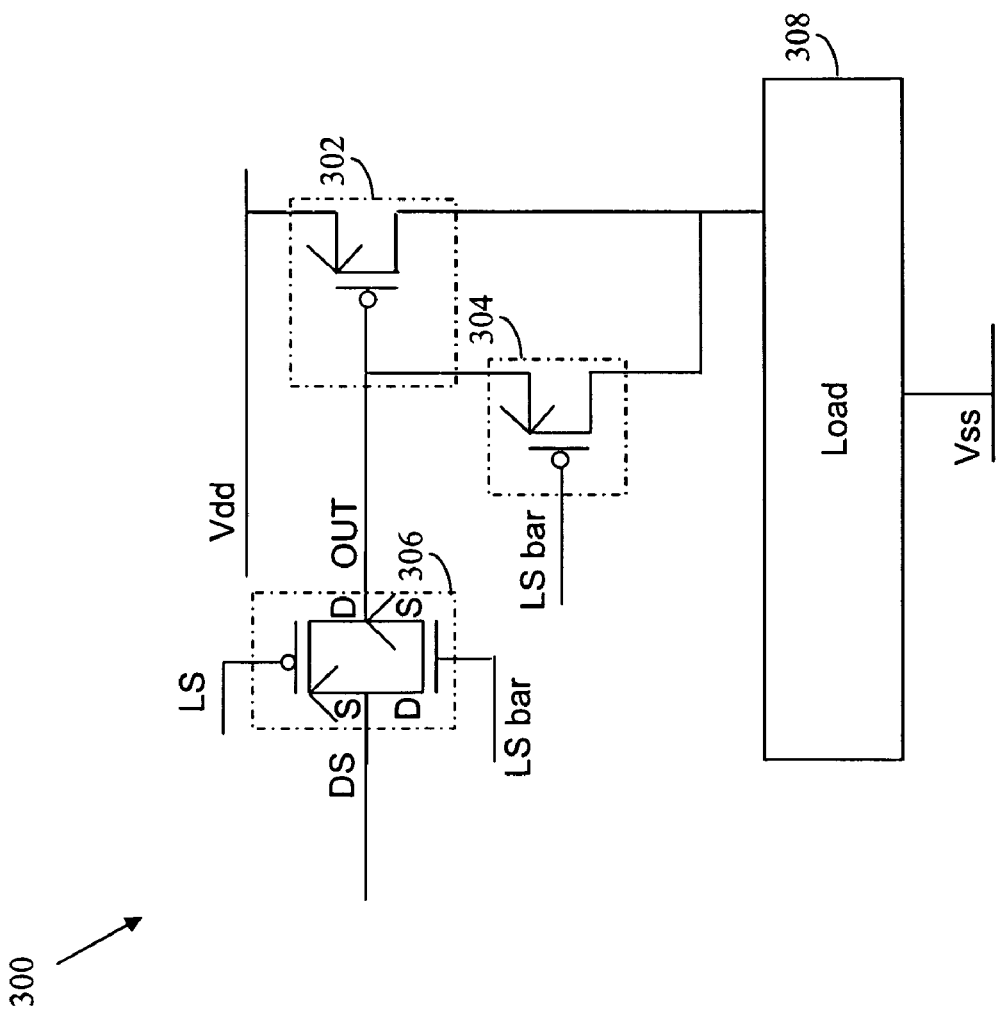
FIG. 3 illustrates a combined circuit for full power supply state and reduced power supply state in accordance with an embodiment of the invention.

FIG. 3 illustrates a combined circuit 300 for full power supply state and reduced power supply state in accordance with an embodiment of the invention. Combined circuit 300 includes a transistor 302. In an embodiment of the invention, a drain of transistor 302 is connected to a load 308 and a switch 304. A gate of transistor 302 is connected to switch 304 and an output of a switch 306.

One terminal of switch 304 is connected to an output of switch 306 and the gate of transistor 302, and other terminal to load 308 and the drain of transistor 302.

In an embodiment of the invention, transistor 302 includes a metal-oxide semiconductor (MOS) transistor. In the embodiment shown, a Positive-channel MOS (PMOS) transistor is employed.

In an embodiment of the invention, switch 304 includes switching transistor such as a MOS transistor. In the embodiment shown, a PMOS is employed. Such switching transistor may be fabricated in very small size as desired. Logic "LS bar" is applied to a gate of the PMOS.

In some embodiments of the invention, switch 306 includes a transmission gate. The transmission gate includes a PMOS connected in series with a Negative-channel MOS (NMOS). A source of PMOS is connected to a drain of NMOS and a drain of PMOS is connected to a source of NMOS. Such PMOS and NMOS may be fabricated in very small sizes as desired. Logic "LS bar" is applied to a gate of the NMOS. Logic "LS" is applied to a gate of the PMOS. An input signal (IN) "DS" is applied to the transmission gate.

Examples of switch 306 include but are not limited to complementary switch, tristate switch, transmission gate and pass gate.

Examples of load 308 include but are not limited to integrated circuits, memories, ultra low power memories, memories at 45-65 nanometers (nm), memory peripheries, digital blocks and electronic devices.

In an embodiment of the invention, combined circuit 300 may be implemented between an external power supply and load 308. Combined circuit 300 includes both deep sleep option and light sleep option. The deep sleep option may also be referred as power gating implementation or full power supply implementation.

A table below illustrates working of combined circuit 300.

TABLE 2

| DS | LS | Function |
|---|---|---|
| 0 | 0 | Full Power Supply |
| 0 | 1 | Reduced Power Supply |
| 1 | 0 | Shut Down State |
| 1 | 1 | Reduced Power Supply |

In an embodiment of the invention, Logic "LS" and Logic "LS bar" are applied to gates of PMOS and NMOS of switch 306 respectively. Logic "LS bar" is applied to switch 304. The input signal (IN) "DS" is applied to switch 306.

In an embodiment of the invention, output of switch 306 is applied as signal level to transistor 302. When DS and LS are LOW, switch 304 is OFF; output of switch 306 is LOW (driven by IN); transistor 302 is ON carrying full power; and load 308 receives full power supply. When DS is LOW and LS is HIGH, output of switch 306 is in a high impedance state (not driven by IN); switch 304 is ON making transistor 302 and switch 304 work as a diode in combination; and load 308 receives reduced power supply. When DS is HIGH and LS is LOW, output of switch 306 is HIGH (driven by IN); switch 304 is OFF; transistor 302 is OFF carrying no power; and load 308 is in shut down state. When DS and LS are HIGH, output of switch 306 is in a high impedance state (not driven by IN); switch 304 is ON making transistor 302 and switch 304 work as a diode in combination; and load 308 receives reduced power supply.

In an embodiment of the invention, when LS is HIGH transistor 302 is in an INTERMEDIATE state in which the amount of power transistor 302 carries is controlled by switch 304. Further, flow of power to load 308 is responsive to switch 304.

Figure 4:
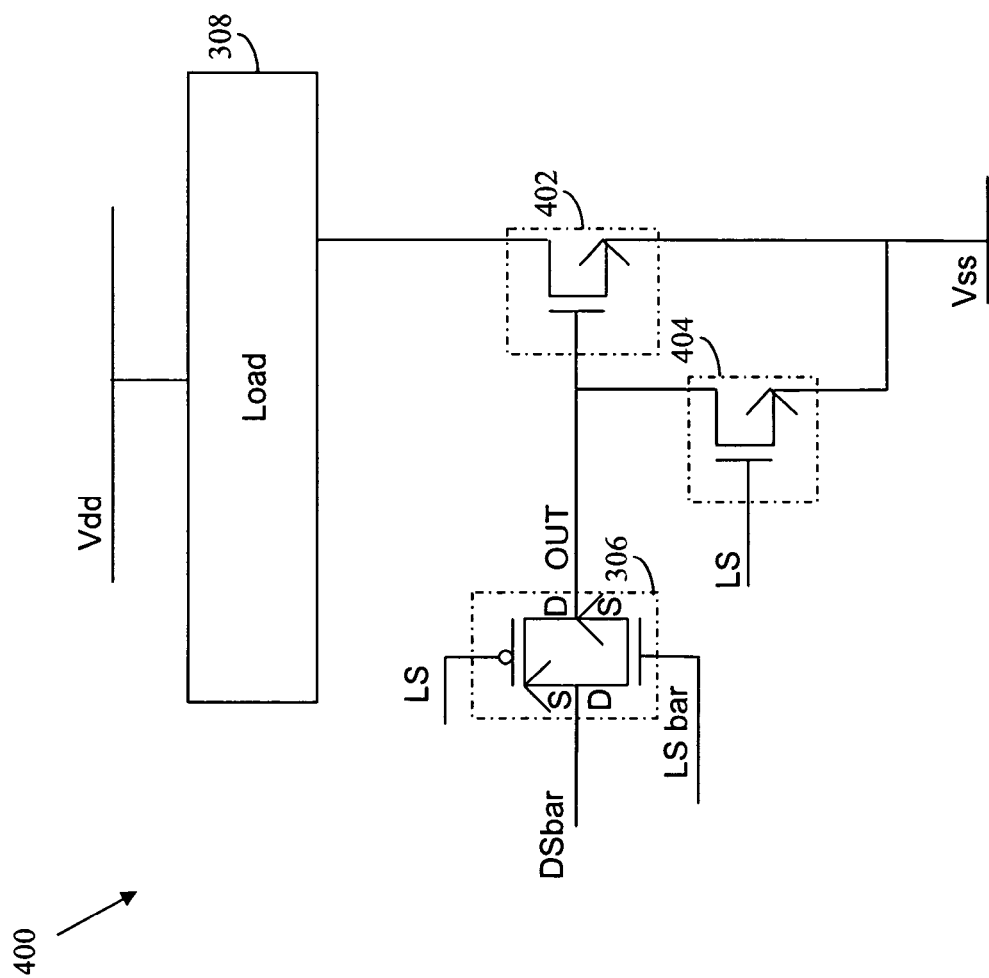
FIG. 4 illustrates a combined circuit for full power supply state and reduced power supply state in accordance with another embodiment of the invention.

FIG. 4 illustrates a combined circuit 400 for full power supply state and reduced power supply state in accordance with an embodiment of the invention. Combined circuit 400 includes a transistor 402. A drain of transistor 402 is connected to a load 308. A source of transistor 402 is connected to switch 404. A gate of transistor 402 is connected to switch 404 and an output of a switch 306.

One terminal of switch 404 is connected to an output of switch 306 and the gate of transistor 402 and other terminal to a common return Vss and the drain of transistor 402.

In an embodiment of the invention, transistor 402 includes a metal-oxide semiconductor (MOS) transistor. In the embodiment shown, a Negative-channel MOS (NMOS) transistor is employed.

In an embodiment of the invention, switch 404 includes switching transistor such as a MOS transistor. In the embodiment shown, an NMOS is employed. Such switching transistor may be fabricated in very small size as desired. Logic "LS" is applied to a gate of the NMOS.

In an embodiment of the invention, switch 306 includes a transmission gate. The transmission gate includes an NMOS connected in series with a Positive-channel MOS (PMOS). A source of PMOS is connected to a drain of NMOS and a drain of PMOS is connected to a source of NMOS. Such PMOS and NMOS may be fabricated in very small sizes as desired. Logic "LS bar" is applied to a gate of the NMOS. Logic "LS" is applied to a gate of the PMOS. An input signal (IN) "DS bar" is applied to the transmission gate.

Examples of switch 306 include but are not limited to complementary switch, tristate switch, transmission gate and pass gate.

Examples of load 308 include but are not limited to integrated circuits, memories, ultra low power memories, memories at 45-65 nanometers (nm), memory peripheries, digital blocks and electronic devices.

In an embodiment of the invention, combined circuit 400 may be implemented between load 308 and the common return Vss. Combined circuit 400 includes both deep sleep option and light sleep option. The deep sleep option may also be referred as power gating implementation or full power supply implementation.

A table below illustrates working of combined circuit 400.

TABLE 3

| DS | LS | Function |
|---|---|---|
| 0 | 0 | Full Power Supply |
| 0 | 1 | Reduced Power Supply |
| 1 | 0 | Shut Down State |
| 1 | 1 | Reduced Power Supply |

In an embodiment of the invention, Logic "LS" and Logic "LS bar" are applied to gates of PMOS and NMOS of switch 306 respectively. Logic "LS" is applied to switch 404. The input signal (IN) "DS bar" is applied to switch 306.

In an embodiment of the invention, output of switch 306 is applied as signal level to transistor 302. When DS and LS are LOW, switch 404 is OFF; output of switch 306 is HIGH; transistor 402 is ON carrying full power and load 308 receives full power supply. When DS is LOW and LS is HIGH, output of switch 306 is in a high impedance state (not driven by IN); switch 404 is ON making transistor 402 and switch 404 work as a diode in combination; and load 308 receives reduced power supply. When DS is HIGH and LS is LOW, output of switch 306 is HIGH (driven by IN); switch 404 is OFF; transistor 402 is OFF carrying no power; and load 308 is in shut down state. When DS and LS are HIGH, output of switch 306 is in a high impedance state (not driven by IN); switch 404 is ON making transistor 402 and switch 404 work as a diode in combination; and load 308 receives reduced power supply.

In an embodiment of the invention, when LS is HIGH transistor 402 is in an INTERMEDIATE state in which the amount of power transistor 402 carries is controlled by switch 404. Further, flow of power to load 308 is responsive to switch 404.

It will be appreciated that the circuits described in FIG. 3 and FIG. 4 may include variations. For example, the circuits may include a fewer or greater number of elements, for example, diodes, transistors than that shown in FIG. 3 and FIG. 4. Further, other elements may be used in place of the elements used in FIG. 3 and FIG. 4, for example, using a conventional diode instead of the PMOS diode or the NMOS diode.

Figure 5:
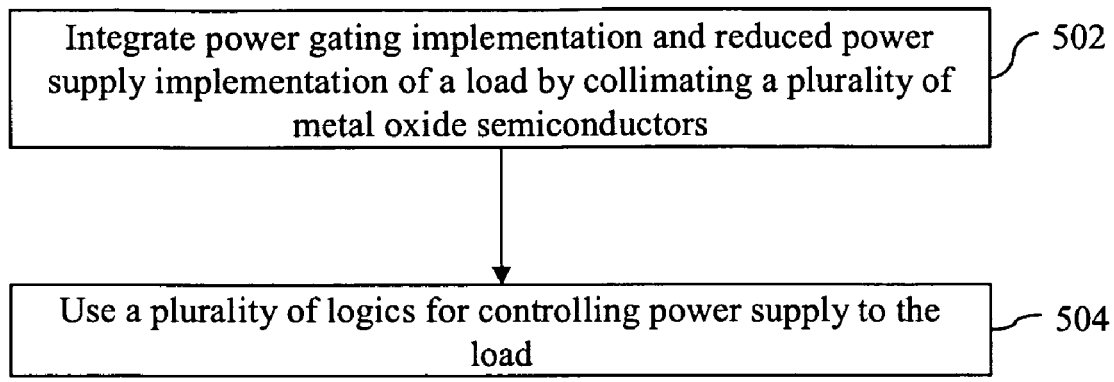
FIG. 5 illustrates a method for power supply regulation in accordance with an embodiment of the invention.

FIG. 5 illustrates a method for power supply regulation in accordance with an embodiment of the invention.

At step 502, power gating implementation and reduced power supply implementation for a load are integrated by collimating a plurality of metal oxide semiconductors. Power gating technique includes deep sleep option. Reduced power supply technique includes light sleep option. In an embodiment of the invention, collimating may include collimating a Positive-channel metal oxide semiconductor (PMOS) and a Negative-channel metal oxide semiconductor (NMOS) with source of the PMOS connected to drain of the NMOS and drain of the PMOS connected to source of the NMOS.

At step 504, a plurality of logics is used to control power supply to the load. In an embodiment of the invention, the plurality of logics is used to control deep sleep, light sleep, full power supply and reduced power supply of the load. The plurality of logics may control the power supply by controlling a plurality of switches.

In an embodiment of the invention, the plurality of logics drive the plurality of metal oxide semiconductors to place the load in a full power supply state, to place the load in a shut down state and to place the load in a state responsive to the switch.

In an embodiment of the invention, one or more steps of the method described in FIG. 5 may be implemented using a machine-readable medium product. Examples of the machine-readable medium product include but are not limited to memory devices, tapes, disks, cassettes, integrated circuits, servers, magnetic media, optical media, online software, download links, installation links, and online links.

Various embodiments of the invention improve area efficiency by using a plurality of switches of small size. Further, the plurality of switches does not consume any power, and reduces junction and gate leakage. The plurality of switches helps in achieving about 5% power saving as compared to traditional implementations. The plurality of switches also helps in achieving about 5%-10% area saving as compared to traditional implementations.

While exemplary embodiments of the invention have been disclosed, the invention may be practiced in other ways. Various modifications and enhancements may be made without departing from the scope of the invention. The invention is to be limited only by the claims.

What is claimed is:

1. A power supply regulation system comprising:
a power transistor having a source connected to a first terminal of a power supply and a drain connected to a first power input terminal of a load,
a connection between a second terminal of the power supply and a second power input terminal of the load;
a transmission gate having a signal input that receives an on/off power control signal (DS), a first control input that receives a full/reduced power control signal (LS), a second control input that receives a complement (LS-bar) of the full/reduced power control signal, and an output connected to the gate of the power transistor; and
a switching transistor having a source connected to a gate of the power transistor, a drain connected to the drain of the power transistor, and a gate connected to receive the complement of the full/reduced power control signal,
whereby, when the full/reduced power control signal assumes a logic level corresponding with full power control, the transmission gate couples the on/off power control signal to the gate of the power transistor and the switching transistor is switched off, and when the full/reduced power control signal assumes a logic level corresponding with reduced power, the transmission gate output goes to a high-impedance state and the switching transistor causes the power transistor to enter a resistive state that conducts reduced power from the power supply to the load.

2. A system as in claim 1 wherein:
the power transistor comprises a PMOS transistor;
the source of the power transistor is connected to a positive terminal of the power supply; and
the switching transistor comprises a PMOS transistor.

3. A system as in claim 1 wherein:
the power transistor comprises an NMOS transistor;
the source of the power transistor is connected to a negative terminal of the power supply; and
the switching transistor comprises an NMOS transistor.

4. A system as in claim 1 wherein the transmission gate comprises a PMOS transistor and an NMOS transistor each having a drain connected to a source of the other.

\* \* \* \* \*